US012812957B2

(12) United States Patent
Nagakura et al.

(10) Patent No.: US 12,812,957 B2
(45) Date of Patent: Nov. 24, 2026

(54) SEMICONDUCTOR DEVICE AND METHOD OF MANUFACTURING SEMICONDUCTOR DEVICE

(71) Applicant: ROHM CO., LTD., Kyoto (JP)

(72) Inventors: So Nagakura, Kyoto (JP); Jun Kobayashi, Kyoto (JP); Satoshi Iwahashi, Kyoto (JP); Kazuyoshi Maki, Kyoto (JP); Shu Nakashima, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 717 days.

(21) Appl. No.: 18/150,212

(22) Filed: Jan. 5, 2023

(65) Prior Publication Data

US 2023/0253473 A1 Aug. 10, 2023

(30) Foreign Application Priority Data

Feb. 10, 2022 (JP) ................................ 2022-019439

(51) Int. Cl.
*H10D 30/66* (2025.01)
*H10D 30/01* (2025.01)
(Continued)

(52) U.S. Cl.
CPC ....... *H10D 64/679* (2025.01); *H10D 30/0291* (2025.01); *H10D 30/66* (2025.01);
(Continued)

(58) Field of Classification Search
CPC ........ H10D 30/0291–0295; H10D 30/66–669; H10D 30/65–659; H10D 30/0281–0289;
(Continued)

(56) References Cited

U.S. PATENT DOCUMENTS

2007/0128810 A1* 6/2007 Kao .................... H10D 30/603 257/E29.268
2012/0273884 A1* 11/2012 Yedinak .............. H10D 30/665 257/341

FOREIGN PATENT DOCUMENTS

JP H1154746 A 2/1999
JP 2007207784 A 8/2007
(Continued)

OTHER PUBLICATIONS

Office Action issued on Oct. 21, 2025 in corresponding Japanese patent application No. 2022-019439 (8 pages; with English translation).

*Primary Examiner* — Yu Chen
(74) *Attorney, Agent, or Firm* — XSENSUS LLP

(57) ABSTRACT

A method of manufacturing a semiconductor device having a super junction structure, includes: forming a first-conductivity-type semiconductor layer having a first surface and a second surface opposite to the first surface; forming a second-conductivity-type pillar region in the semiconductor layer; forming an insulating layer which covers the second surface of the semiconductor layer; forming a metal layer on the insulating layer; forming a gate electrode including a first opening passing through the metal layer by selectively removing the metal layer; and etching the insulating layer via the first opening, wherein the etching the insulating layer includes partially exposing the semiconductor layer by forming a second opening having a curved sidewall in the insulating layer by isotropic etching, and wherein an exposed surface of the semiconductor layer forms a flat surface continuous with the second surface of the semiconductor layer covered with the insulating layer.

7 Claims, 13 Drawing Sheets

(51) Int. Cl.
*H10D 62/10* (2025.01)
*H10D 64/27* (2025.01)
*H10D 64/66* (2025.01)
*H10D 64/68* (2025.01)

(52) U.S. Cl.
CPC ......... *H10D 62/111* (2025.01); *H10D 64/516* (2025.01); *H10D 64/687* (2025.01); *H10D 64/661* (2025.01)

(58) Field of Classification Search
CPC .. H10D 64/516; H10D 64/687; H10D 64/679; H10D 64/683; H10D 62/115–116
See application file for complete search history.

(56) References Cited

FOREIGN PATENT DOCUMENTS

| | | | |
|---|---|---|---|
| JP | 2009253072 | A | 10/2009 |
| JP | 2020-161712 | A | 10/2020 |

* cited by examiner

SEMICONDUCTOR DEVICE AND METHOD OF MANUFACTURING SEMICONDUCTOR DEVICE

CROSS-REFERENCE TO RELATED APPLICATION

This application is based upon and claims the benefit of priority from Japanese Patent Application No. 2022-019439, filed on Feb. 10, 2022, the entire contents of which are incorporated herein by reference.

TECHNICAL FIELD

The present disclosure relates to a semiconductor device and a method of manufacturing the semiconductor device.

BACKGROUND

In the related art, a MISFET (Metal-Insulator-Semiconductor Field-Effect-Transistor) having a super junction structure has been disclosed. The MISFET includes an $n^+$-type drain layer, an $n^-$-type drift layer, a p-type channel region, a p-type pillar layer, an $n^+$-type source region, a $p^+$-type channel contact region, a gate electrode, a gate insulating film, and an interlayer insulating film. The p-type pillar layer extends from the p-type channel region toward the $n^+$-type drain layer.

In a process of etching a gate insulating film formed on a semiconductor layer of a MISFET having a super junction structure, there may be a case in which a step is formed in the surface of the semiconductor layer. Such a step may cause local stress concentration, and as a result, it is possible to generate defects in the semiconductor layer. The defects generated in the semiconductor layer can cause an increase in drain-source leakage current $I_{DSS}$ of the MISFET.

SUMMARY

According to one embodiment of the present disclosure, a method of manufacturing a semiconductor device having a super junction structure includes: forming a first-conductivity-type semiconductor layer having a first surface and a second surface opposite to the first surface; forming a second-conductivity-type pillar region in the semiconductor layer; forming an insulating layer which covers the second surface of the semiconductor layer; forming a metal layer on the insulating layer; forming a gate electrode including a first opening passing through the metal layer by selectively removing the metal layer; and etching the insulating layer via the first opening, wherein the etching the insulating layer includes partially exposing the semiconductor layer by forming a second opening having a curved sidewall in the insulating layer by isotropic etching, and wherein an exposed surface of the semiconductor layer forms a flat surface continuous with the second surface of the semiconductor layer covered with the insulating layer.

According to another embodiment of the present disclosure, a semiconductor device having a super junction structure includes: a semiconductor layer having a first surface and a second surface opposite to the first surface; a first insulating layer formed on the second surface of the semiconductor layer; a gate electrode formed on the first insulating layer; a second insulating layer formed on the gate electrode; a third insulating layer which covers the first insulating layer and the second insulating layer; and a source electrode which is formed on the third insulating layer and includes a source contact portion in contact with the semiconductor layer by passing through the first insulating layer and the third insulating layer, wherein the first insulating layer includes a gate insulating portion interposed between the gate electrode and the semiconductor layer, and wherein the gate insulating portion includes a curved side surface located between the gate electrode and the semiconductor layer.

BRIEF DESCRIPTION OF DRAWINGS

The accompanying drawings, which are incorporated in and constitute a part of the specification, illustrate embodiments of the present disclosure.

DETAILED DESCRIPTION

Figure 1:
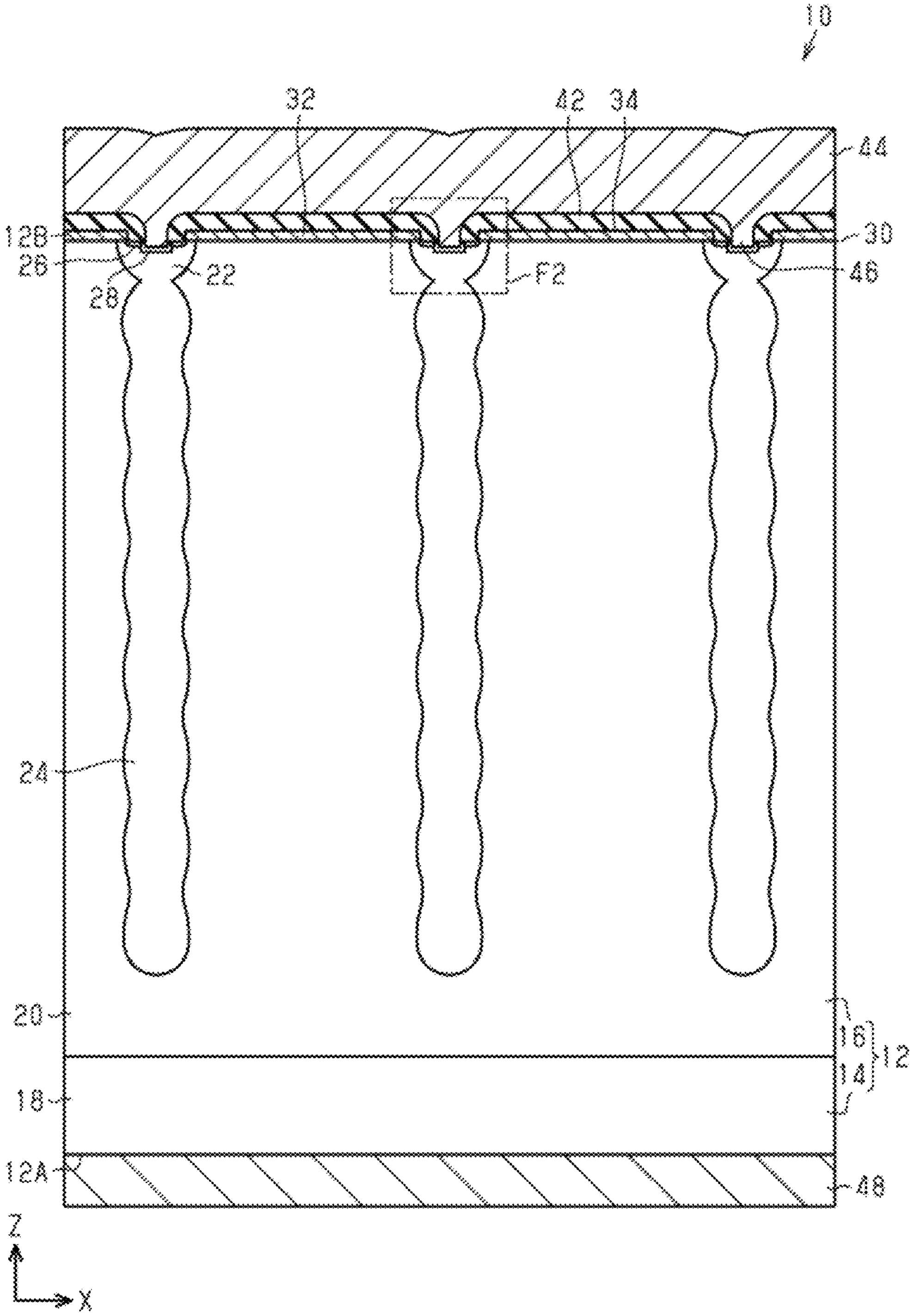
FIG. 1 is a schematic cross-sectional view of an exemplary semiconductor device according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In the present disclosure, "a state where a member A is connected to a member B" includes a case where the member A and the member B are physically and directly connected or even a case where the member A and the member B are indirectly connected through any other member that does not affect an electrical connection state between the members A and B or does not impair functions and effects achieved by combinations of the members A and B.

Similarly, "a state where a member C is installed between a member A and a member B" includes a case where the member A and the member C or the member B and the member C are indirectly connected through any other member that does not affect an electrical connection state between the members A and C or the members B and C or does not impair functions and effects achieved by combinations of the members A and C or the members B and C, in addition to a case where the member A and the member C or the member B and the member C are directly connected.

Some embodiments of a semiconductor device of the present disclosure will be now described with reference to the accompanying drawings. It should be noted that, for simplicity and clarity of explanation, components shown in the drawings are not necessarily drawn to scale. In order to facilitate understanding, hatching lines may be omitted in cross-sectional views. The accompanying drawings merely illustrate embodiments of the present disclosure and should not be considered as limiting the present disclosure.

The following detailed description includes devices, systems, and methods embodying exemplary embodiments of the present disclosure. This detailed description is for illustrative purposes only and is not intended to limit the embodiments of the present disclosure or the applications and uses of such embodiments.

[Semiconductor Device having Super Junction Structure]

Figure 2:
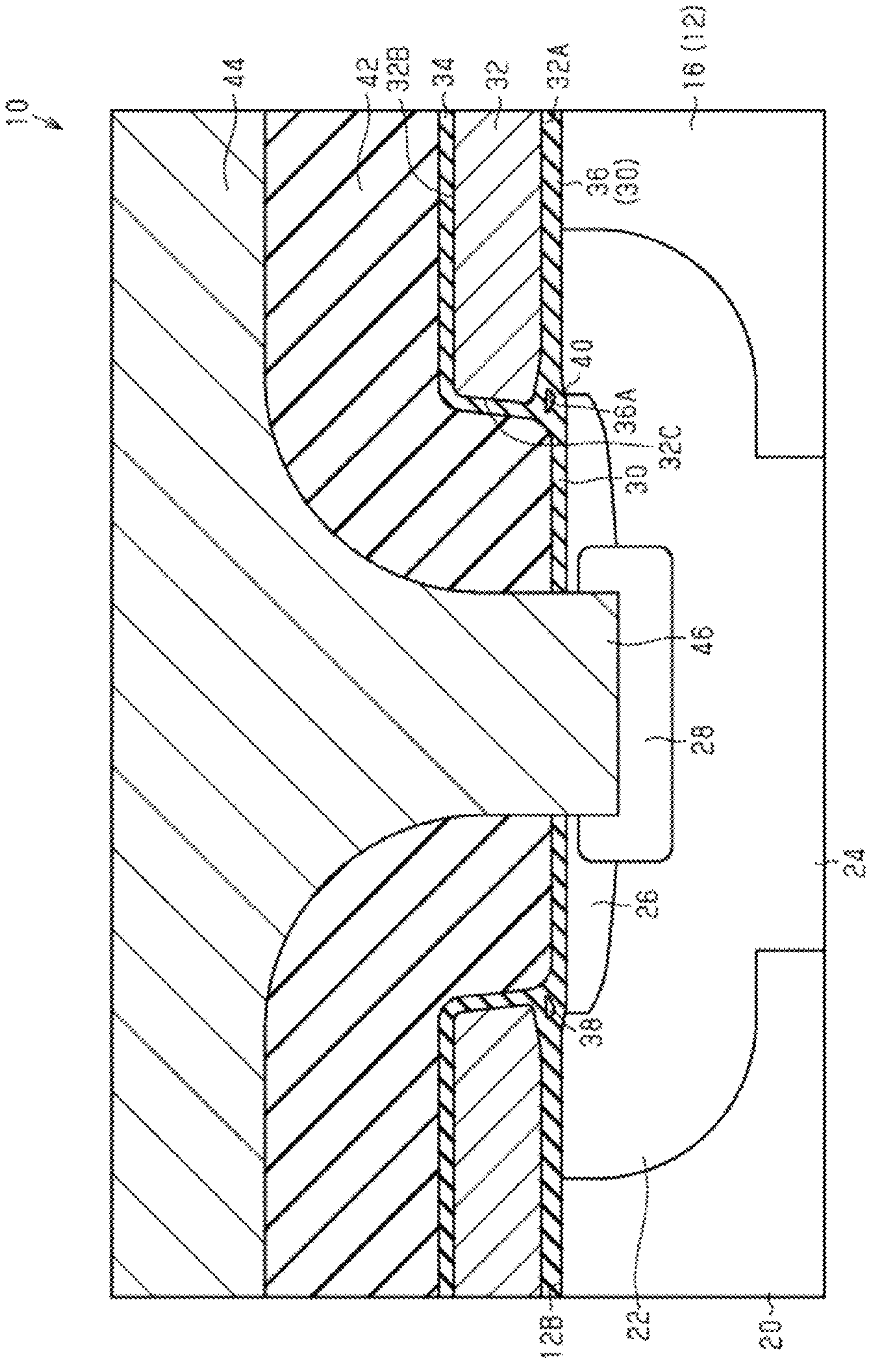
FIG. 2 is a partially-enlarged view of FIG. 1.

FIG. 1 is a schematic cross-sectional view of a semiconductor device 10 having a super junction structure according to an embodiment of the present disclosure. FIG. 2 is a partially-enlarged view of FIG. 1, in which a portion F2 surrounded by a dash-dot chain line in FIG. 1 is enlarged.

As shown in FIG. 1, the semiconductor device 10 includes a semiconductor layer 12 having a first surface 12A and a second surface 12B opposite to the first surface 12A. A Z axis shown in FIG. 1 extends in a Z direction orthogonal to the first surface 12A and the second surface 12B. The term “plan view” used in the present disclosure refers to viewing the semiconductor device 10 in the Z direction. The term “plan view” used in the present disclosure refers to viewing the semiconductor device 10 from above along the Z axis unless explicitly stated otherwise. The semiconductor layer 12 may include a semiconductor substrate 14 and an epitaxial layer 16 formed on the semiconductor substrate 14. The semiconductor substrate 14 may include the first surface 12A of the semiconductor layer 12, and the epitaxial layer 16 may include the second surface 12B of the semiconductor layer 12.

The semiconductor substrate 14 may be an $n^+$-type semiconductor substrate containing n-type impurities. In one example, the semiconductor substrate 14 may be a silicon (Si) substrate. In another example, the semiconductor substrate 14 may be a silicon carbide (SiC) substrate, a gallium nitride (GaN) substrate, or any semiconductor substrate applicable to a MISFET. The n-type impurity concentration of the semiconductor substrate 14 can be, for example, $1.0\times10^{18}$ $cm^{-3}$ to $5.0\times10^{20}$ $cm^{-3}$.

The epitaxial layer 16 may be an $n^-$-type layer containing n-type impurities epitaxially grown on the semiconductor substrate 14. In one example, the epitaxial layer 16 may be a Si epitaxial layer. The impurity concentration of the epitaxial layer 16 may be, for example, $1.0\times10^{10}$ $cm^{-3}$ to $1.0\times10^{16}$ $cm^{-3}$.

The semiconductor layer 12 can include a drain region 18, a drift region 20, a channel region 22, a pillar region 24, a source region 26, and a channel contact region 28. The drain region 18 may correspond to the semiconductor substrate 14. The drift region 20, the channel region 22, the pillar region 24, the source region 26, and the channel contact region 28 can be formed within the epitaxial layer 16.

The channel region 22 can be formed from the second surface 12B of the semiconductor layer 12 to a predetermined depth. The channel region 22 may be a region implanted with p-type impurities within the epitaxial layer 16. The impurity concentration of the channel region 22 can be, for example, $1.0\times10^{15}$ $cm^{-3}$ to $1.0\times10^{19}$ $cm^{-3}$.

The pillar region 24 may be formed continuously with the channel region 22. The pillar regions 24 can extend within the epitaxial layer 16 from the channel region 22 toward the drain region 18 (the semiconductor substrate 14). Since the pillar region 24 does not reach the drain region 18, the drift region 20 may spread between the pillar region 24 and the drain region 18. The pillar regions 24 may or may not have a constant width. In one example, the width of the pillar regions 24 may vary periodically along the Z direction, as shown in FIG. 1. The pillar region 24 may be a region implanted with p-type impurities within the epitaxial layer 16. The impurity concentration of the pillar region 24 can be, for example, $1.0\times10^{15}$ $cm^{-3}$ to $1.0\times10^{19}$ $cm^{-3}$. The impurity concentration of the pillar regions 24 may be the same as the impurity concentration of the channel region 22.

The source region 26 can be formed within the channel region 22 to a predetermined depth from the second surface 12B of the semiconductor layer 12. The source region 26 is formed to be shallower than the channel region 22. The source region 26 may be a region implanted with n-type impurities within the channel region 22. The impurity concentration of the source region 26 can be, for example, $1.0\times10^{18}$ $cm^{-3}$ to $5.0\times10^{20}$ $cm^{-3}$. The impurity concentration of the source region 26 may be higher than that of the drift region 20.

The channel contact region 28 can be formed below a source contact portion 46 of a source electrode 44 which will be described later. The channel contact region 28 may be adjacent to the channel region 22 and the source region 26. The channel contact region 28 may be a region implanted with p-type impurities within the channel region 22 and the source region 26. The impurity concentration of the channel contact region 28 can be, for example, $5.0\times10^{17}$ $cm^{-3}$ to $1.0\times10^{19}$ $cm^{-3}$. The impurity concentration of the channel contact region 28 may be higher than that of the channel region 22.

In the present disclosure, the n-type and the p-type are also referred to as a first conductivity type and a second conductivity type, respectively. Therefore, the semiconductor layer 12 can include a first-conductivity-type drain region 18 having the first surface 12A, a first-conductivity-type drift region 20 formed on the drain region 18, a second-conductivity-type channel region 22 formed on the second surface 12B, and a second-conductivity-type pillar region 24 connected to the channel region 22 and extending toward the drain region 18.

The n-type impurities may be, for example, at least one of phosphorus (P), arsenic (As), and antimony (Sb). Further, the p-type impurities may be, for example, at least one of boron (B) and aluminum (Al).

As shown in FIG. 2, the semiconductor device 10 can further include a first insulating layer 30 formed on the second surface 12B of the semiconductor layer 12, a gate electrode 32 formed on the first insulating layer 30, and a second insulating layer 34 formed on the gate electrode 32.

The first insulating layer 30 includes a gate insulating portion 36 interposed between the gate electrode 32 and the semiconductor layer 12. In other words, the gate insulating portion 36 may be a portion of the first insulating layer 30 on which the gate electrode 32 is formed. Therefore, the bottom surface 32A of the gate electrode 32 can be in contact with the gate insulating portion 36. On the other hand, the top surface 32B and the side surfaces 32C of the gate electrode 32 can be in contact with the second insulating layer 34.

The gate insulating portion 36 may cover a portion of the surface of the source region 26, the surface of the channel region 22, and the surface of the drift region 20 in the semiconductor layer 12. The gate insulating portion 36 can include a curved side surface 36A located between the gate electrode 32 and the semiconductor layer 12. The curved side surface 36A is formed by performing isotropic etching in an etching process for forming the gate insulating portion 36, which will be described later with reference to FIG. 6. In the present embodiment, the first insulating layer 30 and the second insulating layer 34 can form a cavity 38. The cavity 38 is at least partially surrounded by the curved side surface 36A. At least a portion of the cavity 38 can be located between the gate electrode 32 and the semiconductor layer 12.

The second surface 12B of the semiconductor layer 12 may include a step 40 located below the curved side surface 36A of the gate insulating portion 36. The step 40 may be less than 25 nm in the direction orthogonal to the second surface 12B. At least a portion of the cavity 38 can be located between the gate electrode 32 and the step 40.

The semiconductor device 10 may further include a third insulating layer 42 covering the first insulating layer 30 and the second insulating layer 34, and a source electrode 44 formed on the third insulating layer 42. The source electrode 44 can include the source contact portion 46 which contacts the semiconductor layer 12 by passing through the first insulating layer 30 and the third insulating layer 42. The source contact portion 46 can contact the channel contact region 28 by passing through the source region 26. The source electrode 44 may be made of, for example, AlSiCu.

The first insulating layer 30 and the second insulating layer 34 may be formed of a thermal oxide film, and the third insulating layer 42 may be formed of a CVD film. Here, the thermal oxide film may be a silicon dioxide ($SiO_2$) film formed by a thermal oxidation method. Further, the CVD film may be a $SiO_2$ film formed by a chemical vapor deposition (CVD) method. More specifically, the CVD film may include a USG (Undoped Silicate Glass) film, a BPSG (Boron-Doped Phospho-Silicate Glass) film, or both. Since the cavity 38 is formed by the first insulating layer 30 and the second insulating layer 34, it can be surrounded by the thermal oxide film. The gate electrode 32 can be formed of, for example, conductive polysilicon.

Returning to FIG. 1, the semiconductor device 10 can further include a drain electrode 48 formed on the first surface 12A of the semiconductor layer 12. The drain electrode 48 may be electrically connected to the drain region 18. The drain electrode 48 can be formed from at least one of Ti, Ni, Au, Ag, Cu, Al, a Cu alloy, and an Al alloy.

In this way, the semiconductor device 10 can include the drain electrode 48 formed on the first surface 12A of the semiconductor layer 12, and the source electrode 44 formed above the second surface 12B. Therefore, the semiconductor device 10 can be a vertical device in which a main current flows in a direction intersecting the first surface 12A and the second surface 12B of the semiconductor layer 12. In an upper portion including the second surface 12B of the semiconductor layer 12, the n-type drift region 20 and the p-type pillar region 24 are alternately arranged as shown in FIG. 1. In the semiconductor device 10 having such a super junction structure, a depletion layer spreads from a pn junction surface between the n-type drift region 20 and the p-type pillar region 24, and can be formed to be as deep as the pillar region 24 in the drift region 20. Thereby, the breakdown voltage of the semiconductor device 10 can be improved.

[Method of Manufacturing Semiconductor Device]

Next, an example of a method of manufacturing the semiconductor device 10 having the super junction structure according to the present embodiment will be described.

FIGS. 3 to 11 are schematic cross-sectional views showing exemplary manufacturing processes of the semiconductor device 10. FIGS. 3 to 11 show the same portions as those of the semiconductor device 10 shown in FIG. 2. For ease of understanding, in FIGS. 3 to 11, the same components as those in FIG. 2 are denoted by the same reference numerals.

Figure 3:
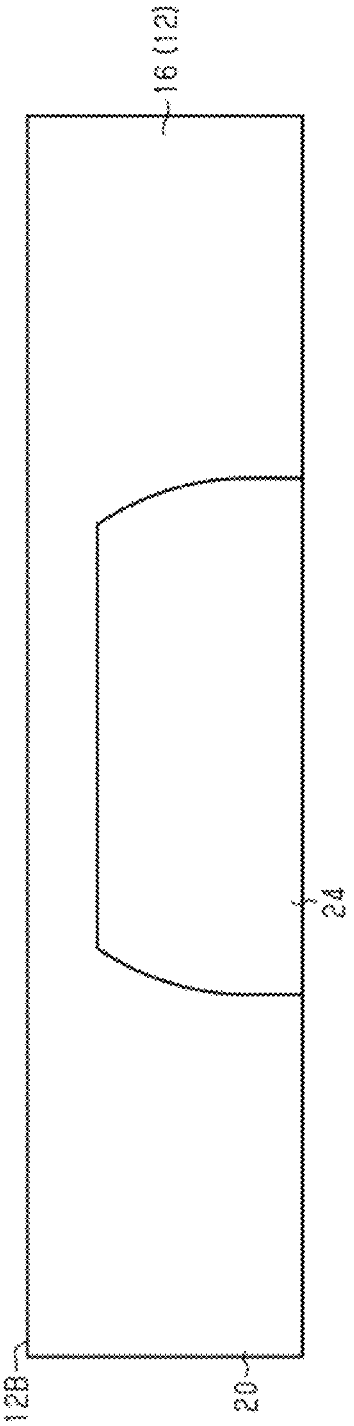
FIG. 3 is a schematic cross-sectional view showing an exemplary manufacturing process of the semiconductor device shown in FIG. 2.

As shown in FIG. 3, a method of manufacturing the semiconductor device 10 may include forming an n-type semiconductor layer 12 having a first surface 12A (see FIG. 1) and a second surface 12B opposite to the first surface 12A, and forming a p-type pillar region 24 within the semiconductor layer 12. The pillar region 24 can be formed by implanting p-type impurities into the semiconductor layer 12 (an epitaxial layer 16). More specifically, the pillar regions 24 extending in the Z direction may be formed in the semiconductor layer 12 by repeating the formation of the n-type epitaxial layer into which p-type impurities are selectively implanted a plurality of times. In another example, the pillar region 24 may be formed by forming a trench in the epitaxial layer 16 and growing a p-type epitaxial layer in the trench.

Figure 4:
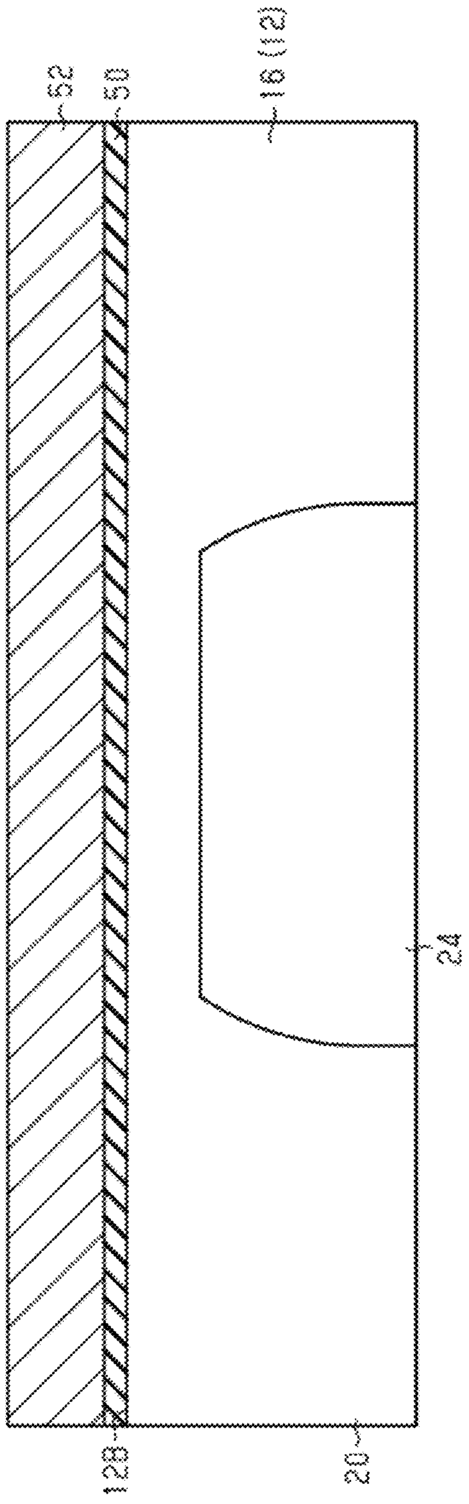
FIG. 4 is a schematic cross-sectional view showing a manufacturing process subsequent to FIG. 3.

FIG. 4 is a schematic cross-sectional view showing a manufacturing process subsequent to FIG. 3. As shown in FIG. 4, the manufacturing method may include forming an insulating layer 50 covering the second surface 12B of the semiconductor layer 12, and forming a metal layer 52 on the insulating layer 50. The insulating layer 50 may be, for example, $SiO_2$ formed by a thermal oxidation method. The metal layer 52 may be conductive polysilicon.

Figure 5:
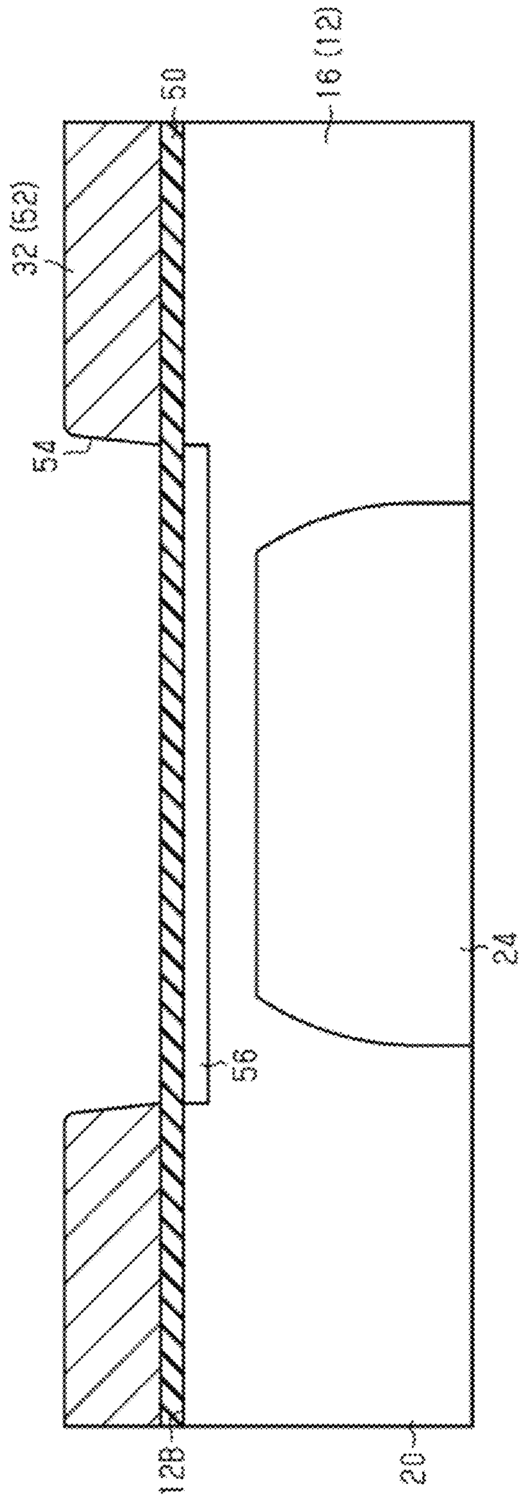
FIG. 5 is a schematic cross-sectional view showing a manufacturing process subsequent to FIG. 4.

FIG. 5 is a schematic cross-sectional view showing a manufacturing process subsequent to FIG. 4. As shown in FIG. 5, the manufacturing method may include selectively removing the metal layer 52 and forming a gate electrode 32 including a first opening 54 penetrating through the metal layer 52, and implanting p-type impurities into the semiconductor layer 12 via the first opening 54. The p-type impurities can be implanted into a first region 56 including the second surface 12B of the semiconductor layer 12. The first region 56 is located relatively close to the second surface 12B of the semiconductor layer 12 and is not continuous with the pillar region 24 at this process.

Figure 6:
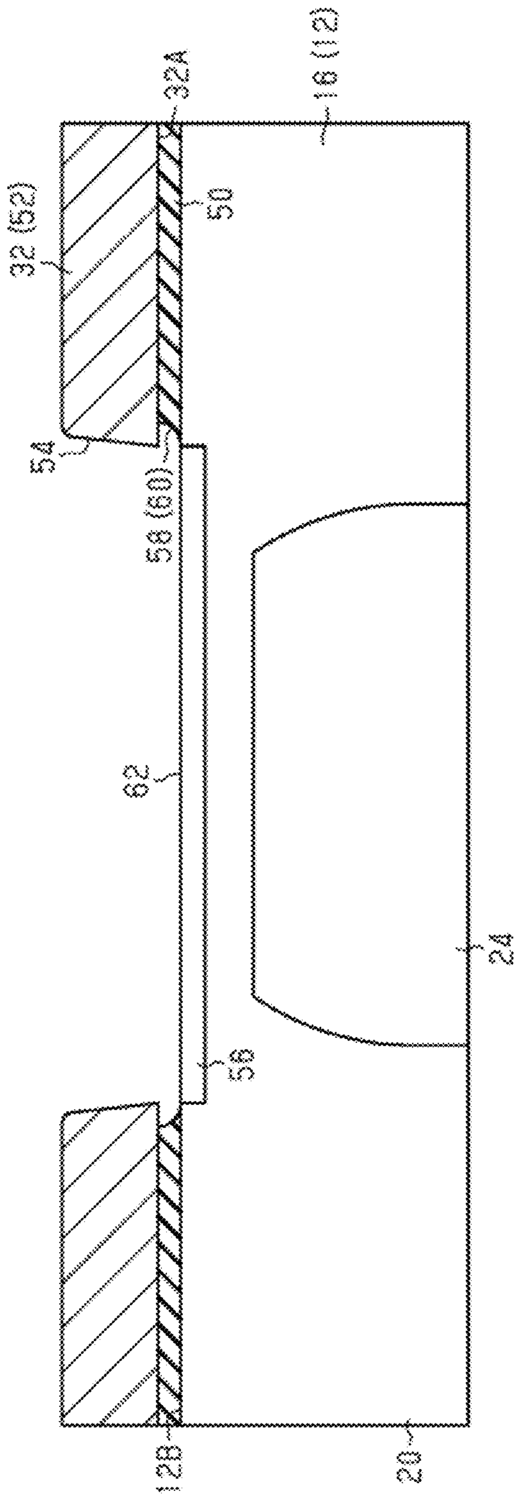
FIG. 6 is a schematic cross-sectional view showing a manufacturing process subsequent to FIG. 5.

FIG. 6 is a schematic cross-sectional view showing a manufacturing process subsequent to FIG. 5. As shown in FIG. 6, the manufacturing method may include etching the insulating layer 50 via the first opening 54. The etching of the insulating layer 50 includes partially exposing the semiconductor layer 12 by forming a second opening 60 having a curved sidewall 58 in the insulating layer 50 by isotropic etching. Further, the insulating layer 50 that is not etched in this process can form a gate insulating portion 36 shown in FIG. 2.

In the isotropic etching, the etching of the insulating layer 50 proceeds not only in a direction orthogonal to the surface of the insulating layer 50 (a direction orthogonal to the second surface 12B of the semiconductor layer 12) but also in a lateral direction (a direction parallel to the second surface 12B). As a result, a portion of the bottom surface 32A of the gate electrode 32 (a portion continuous with the first opening 54) is exposed and an undercut is formed in the insulating layer 50. Accordingly, the second opening 60 may be at least partially larger than the first opening 54. Since the sidewall 58 is curved, the second opening 60 can have a smaller dimension as it approaches closer to the second surface 12B of the semiconductor layer 12 than the gate electrode 32. The curved sidewall 58 of the second opening 60 may be located between the gate electrode 32 and the semiconductor layer 12. By causing a thermal oxide film 64, which will be described later with reference to FIGS. 7 and 8, to grow on the curved sidewall 58 formed by the isotropic etching, a curved side surface 36A of the gate insulating portion 36 shown in FIG. 2 can be formed.

Since the isotropic etching is employed in this process, an exposed surface 62 of the semiconductor layer 12 may be hardly etched. Therefore, the exposed surface 62 of the semiconductor layer 12 can form a flat surface continuous with the second surface 12B of the semiconductor layer 12 covered with the insulating layer 50. In other words, the isotropic etching does not form a step, which may cause defects in the semiconductor layer 12, on the second surface 12B of the semiconductor layer 12.

In one example, the isotropic etching can be performed by wet-etching. In another example, the isotropic etching may be performed, for example, by dry-etching using a reactive gas (chemical dry-etching).

Figure 7:
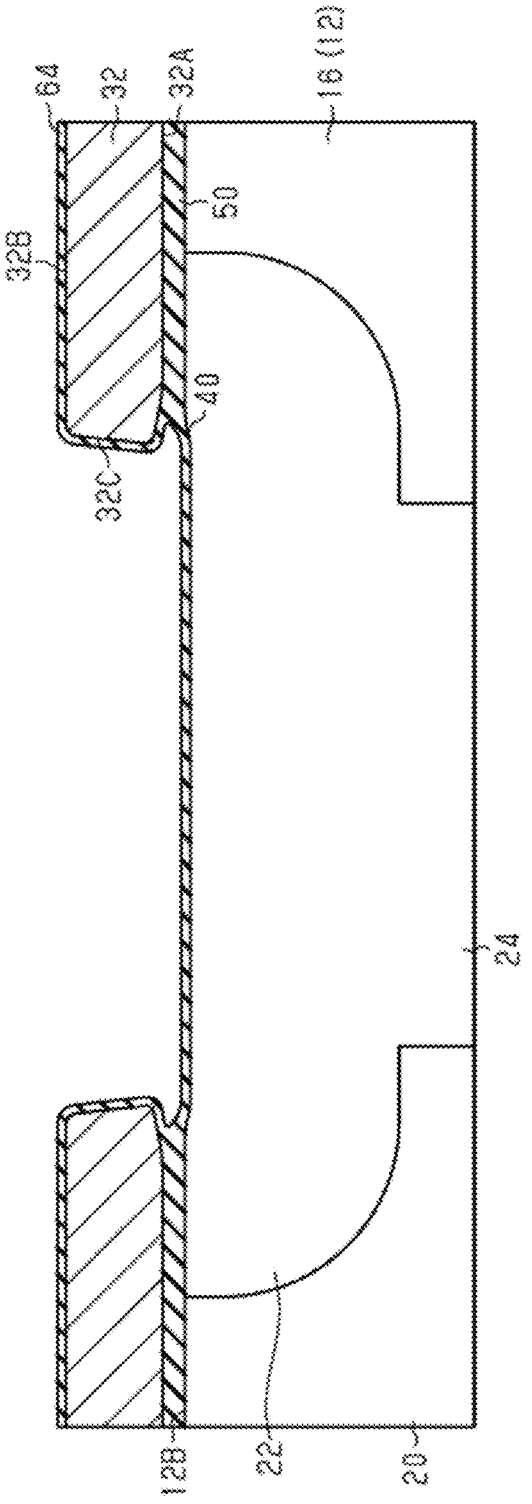
FIG. 7 is a schematic cross-sectional view showing a manufacturing process subsequent to FIG. 6.

FIG. 7 is a schematic cross-sectional view showing a manufacturing process subsequent to FIG. 6. As shown in FIG. 7, the manufacturing method may further include forming a thermal oxide film 64 on the gate electrode 32, the insulating layer 50, and the semiconductor layer 12. In this process, the p-type impurities contained in the first region 56 (see FIG. 6) are diffused into the semiconductor layer 12 by annealing and a channel region 22 is formed. Thereby, the channel region 22 may be formed continuously with the pillar region 24. The thermal oxide film 64 can be formed by a reaction between the exposed surfaces of the gate electrode 32, the insulating layer 50, and the semiconductor layer 12 and oxygen. As a result, the top surface 32B, the side surfaces 32C, and a portion of the bottom surface 32A of the gate electrode 32, the curved sidewall 58 of the insulating layer 50, and the exposed surface 62 (see FIG. 6) of the semiconductor layer 12 can be covered with the thermal oxide film 64. This oxidation reaction can change the shape of the semiconductor layer 12 and the gate electrode 32 from those shown in FIG. 6. More specifically, by slightly recessing the exposed surface 62 shown in FIG. 6, a step 40 can be formed on the flat surface of the semiconductor layer 12 formed by the exposed surface 62 and the second surface 12B. The step 40 is formed near the curved sidewall 58 and thus can be located below the gate electrode 32. The step 40 located below the gate electrode 32 is relatively small, and in one example may be less than 25 nm in the direction orthogonal to the second surface 12B.

Figure 8:
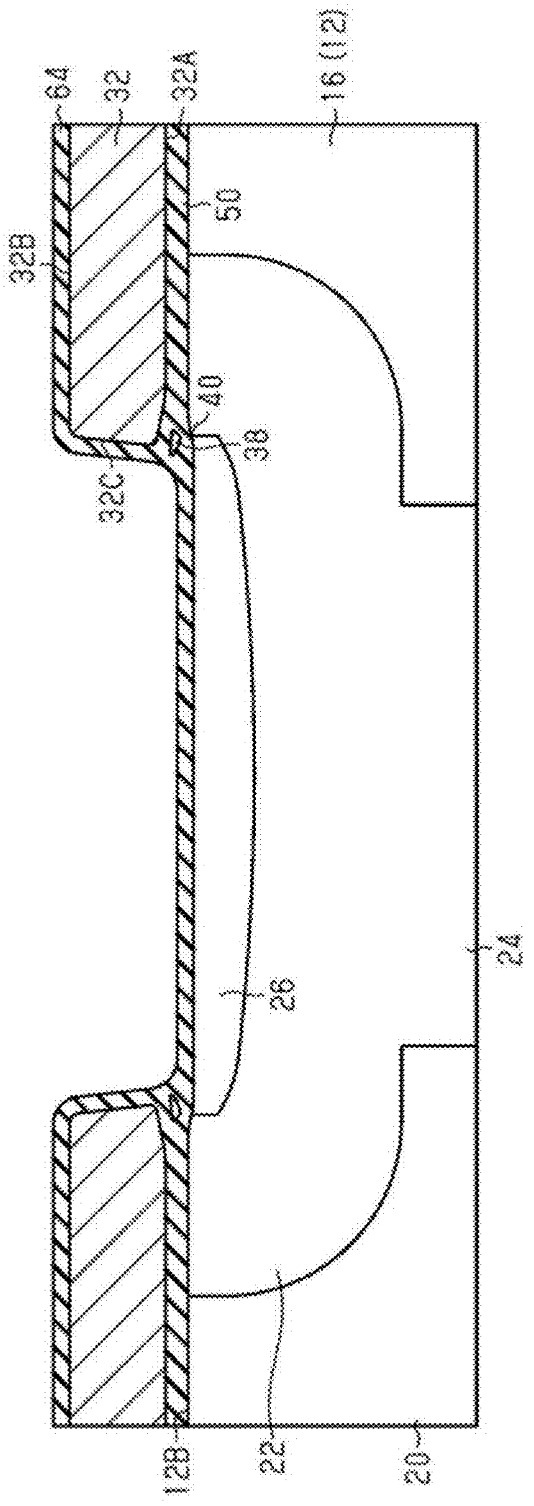
FIG. 8 is a schematic cross-sectional view showing a manufacturing process subsequent to FIG. 7.

FIG. 8 is a schematic cross-sectional view showing a manufacturing process subsequent to FIG. 7. As shown in FIG. 8, the manufacturing method may further include forming a source region 26. In this process, n-type impurities are implanted into the semiconductor layer 12 via the first opening 54 and the second opening 60, the implanted n-type impurities are diffused into the semiconductor layer 12 by annealing, and the source region 26 is formed. By this annealing, the thermal oxide film 64 formed in the process shown in FIG. 7 grows even thicker. In the present embodiment, a cavity 38 surrounded by the thermal oxide film 64 is formed due to the undercut of the insulating layer 50 during the growth of the thermal oxide film 64. Thus, forming the thermal oxide layer 64 may include forming the cavity 38 surrounded by the thermal oxide layer 64.

At least a portion of the cavity 38 can be located between the gate electrode 32 and the semiconductor layer 12. By this, the gate insulating portion 36 having the curved sidewall 58 as shown in FIG. 2 can be obtained.

Figure 9:
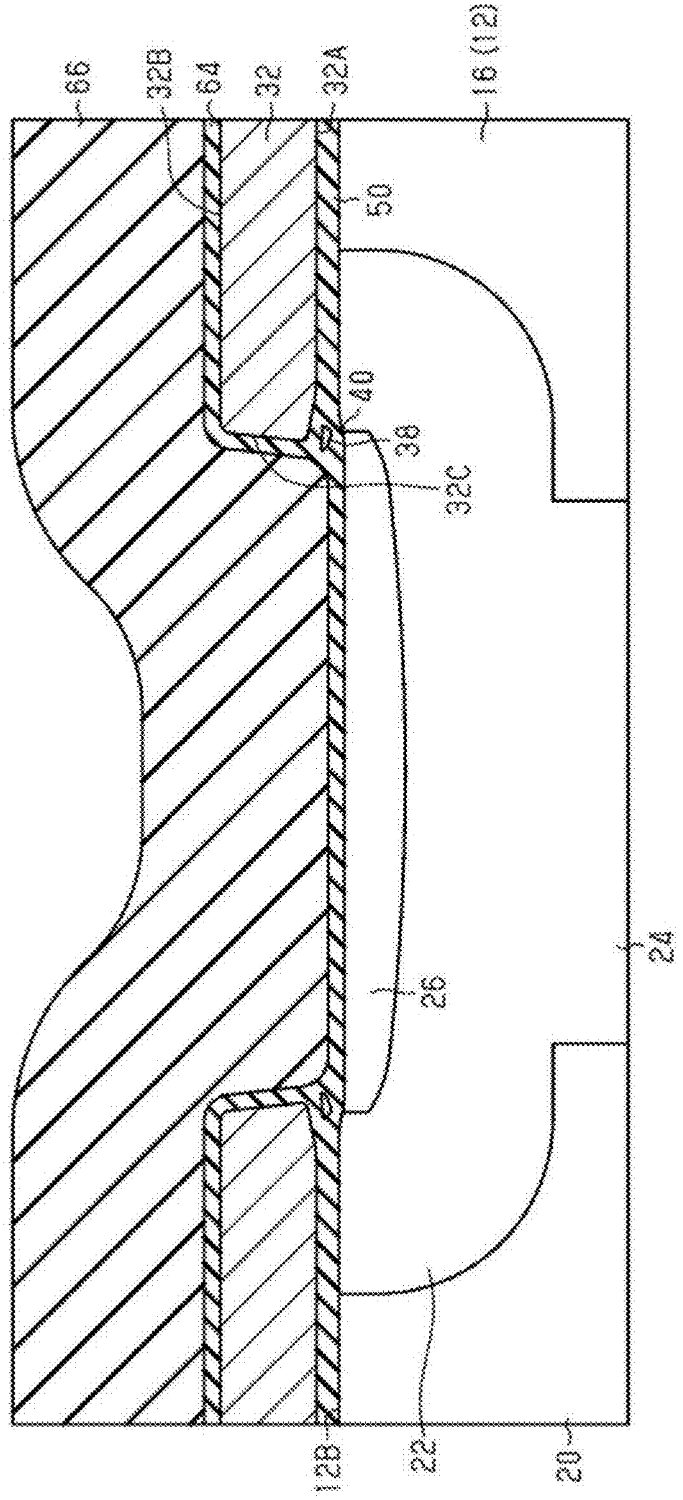
FIG. 9 is a schematic cross-sectional view showing a manufacturing process subsequent to FIG. 8.

FIG. 9 is a schematic cross-sectional view showing a manufacturing process subsequent to FIG. 8. As shown in FIG. 9, the manufacturing method may further include forming a CVD film 66 on the thermal oxide film 64. The CVD film 66 may be a $SiO_2$ film formed by a CVD method. More specifically, the CVD film 66 may include a USG film, a BPSG film, or both.

Figure 10:
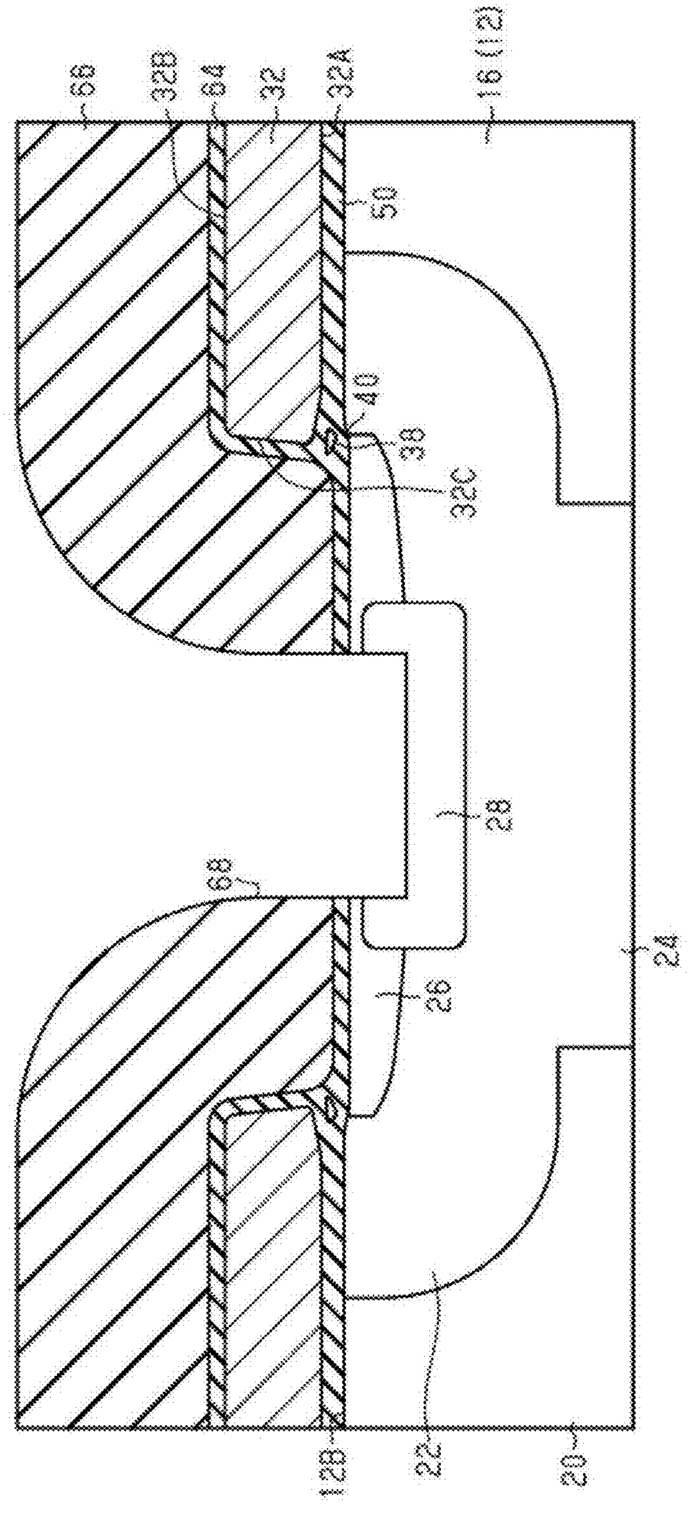
FIG. 10 is a schematic cross-sectional view showing a manufacturing process subsequent to FIG. 9.

FIG. 10 is a schematic cross-sectional view showing a manufacturing process subsequent to FIG. 9. As shown in FIG. 10, the manufacturing method may include forming a channel contact region 28, and forming an opening 68 reaching the channel contact region 28 by passing through the CVD film 66 and the thermal oxide film 64. After this process, a source electrode 44 (see FIG. 2) including a source contact portion 46 in the opening 68 can be formed and the semiconductor device 10 shown in FIG. 2 can be obtained.

Although the method of manufacturing the semiconductor device 10 has been described above as including a plurality of manufacturing processes performed sequentially, it should be understood that some manufacturing processes may be performed in parallel and/or in a different order. Further, some manufacturing processes may be omitted, and a process different from the above example may be performed in any of the manufacturing processes.

[Operation]

The operation of the semiconductor device 10 of the present embodiment will be described below. In the semiconductor device 10 of the present embodiment, the insulating layer 50 covering the second surface 12B of the semiconductor layer 12 is etched in order to form the gate insulating portion 36. In the etching of the insulating layer 50, by the isotropic etching, the second opening 60 having the curved sidewall 58 in the insulating layer 50 is formed and the semiconductor layer 12 is partially exposed. At this time, since the exposed surface 62 of the semiconductor layer 12 is hardly recessed by the isotropic etching, the flat surface continuous with the second surface 12B of the semiconductor layer 12 covered with the insulating layer 50 can be formed.

Figure 11:
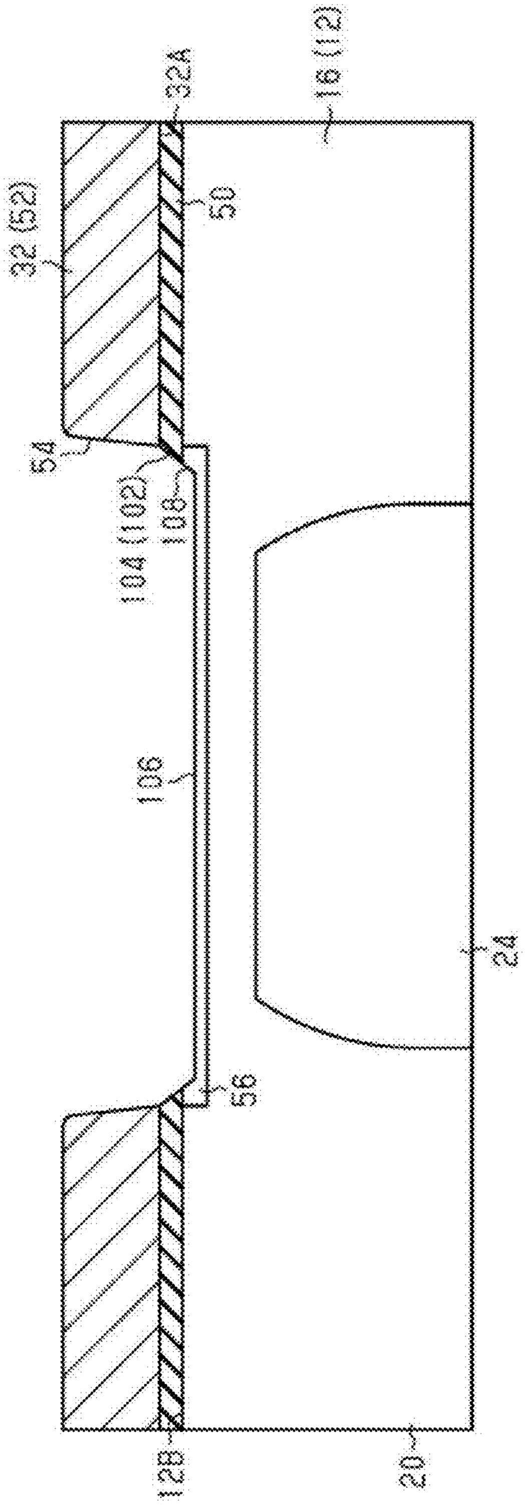
FIG. 11 is a schematic cross-sectional view showing an exemplary etching process for a semiconductor device according to a comparative example.

Here, for comparison, an example in which the insulating layer 50 is etched not by isotropic etching but by anisotropic etching will be described with reference to FIGS. 11 and 12. FIG. 11 is a schematic cross-sectional view showing an exemplary etching process of a semiconductor device 100 (see FIG. 12) according to a comparative example. In FIG. 11, the same components as those of the semiconductor device 10 (in particular, see FIG. 6) are denoted by the same reference numerals. Further, detailed explanation of the same components as those of the semiconductor device 10 will be omitted.

In the process shown in FIG. 11, the insulating layer 50 is etched via the first opening 54, as in the process shown in FIG. 6. The process shown in FIG. 11 is different from the process shown in FIG. 6 in that a second opening 102 is formed in the insulating layer 50 by anisotropic etching.

In the anisotropic etching, the etching of the insulating layer 50 proceeds mainly in a direction orthogonal to the surface of the insulating layer 50 (the direction orthogonal to the second surface 12B of the semiconductor layer 12). In the example of FIG. 11, the anisotropic etching is performed by reactive ion etching. As shown in FIG. 11, the etching proceeds relatively slowly in the insulating layer 50 near the gate electrode 32 which serves as a shield against reactive ions used in the reactive ion etching. In particular, the insulating layer 50 under the bottom surface 32A of the gate electrode 32 is hardly etched, unlike the case of FIG. 6. The second opening 102 has a smaller dimension as it approaches closer to the second surface 12B of the semiconductor layer 12 than the gate electrode 32. As a result, a sidewall 104 of the second opening 102 is not located below the gate electrode 32, and thus the second opening 102 has a size equal to or smaller than that of the first opening 54.

The semiconductor layer 12 exposed via the second opening 102 of the insulating layer 50 is etched from the surface by anisotropic etching, and an exposed surface 106 is recessed from the second surface 12B of the semiconductor layer 12 covered with the insulating layer 50. Thereby, a step 108 occurs between the second surface 12B and the exposed surface 106. In the example of FIG. 11, the step 108 of about 45 nm is formed in the direction orthogonal to the second surface 12B.

In this way, the step 108 formed by the anisotropic etching is relatively large. On the other hand, in the process of FIG. 6, a step in the second surface 12B of the semiconductor layer 12 that may cause defects in the semiconductor layer 12 is not formed by the isotropic etching. As a result, in the case of the isotropic etching shown in FIG. 6, the exposed surface 62 of the semiconductor layer 12 can form a flat surface continuous with the second surface 12B of the semiconductor layer 12 covered with the insulating layer 50.

Figure 12:
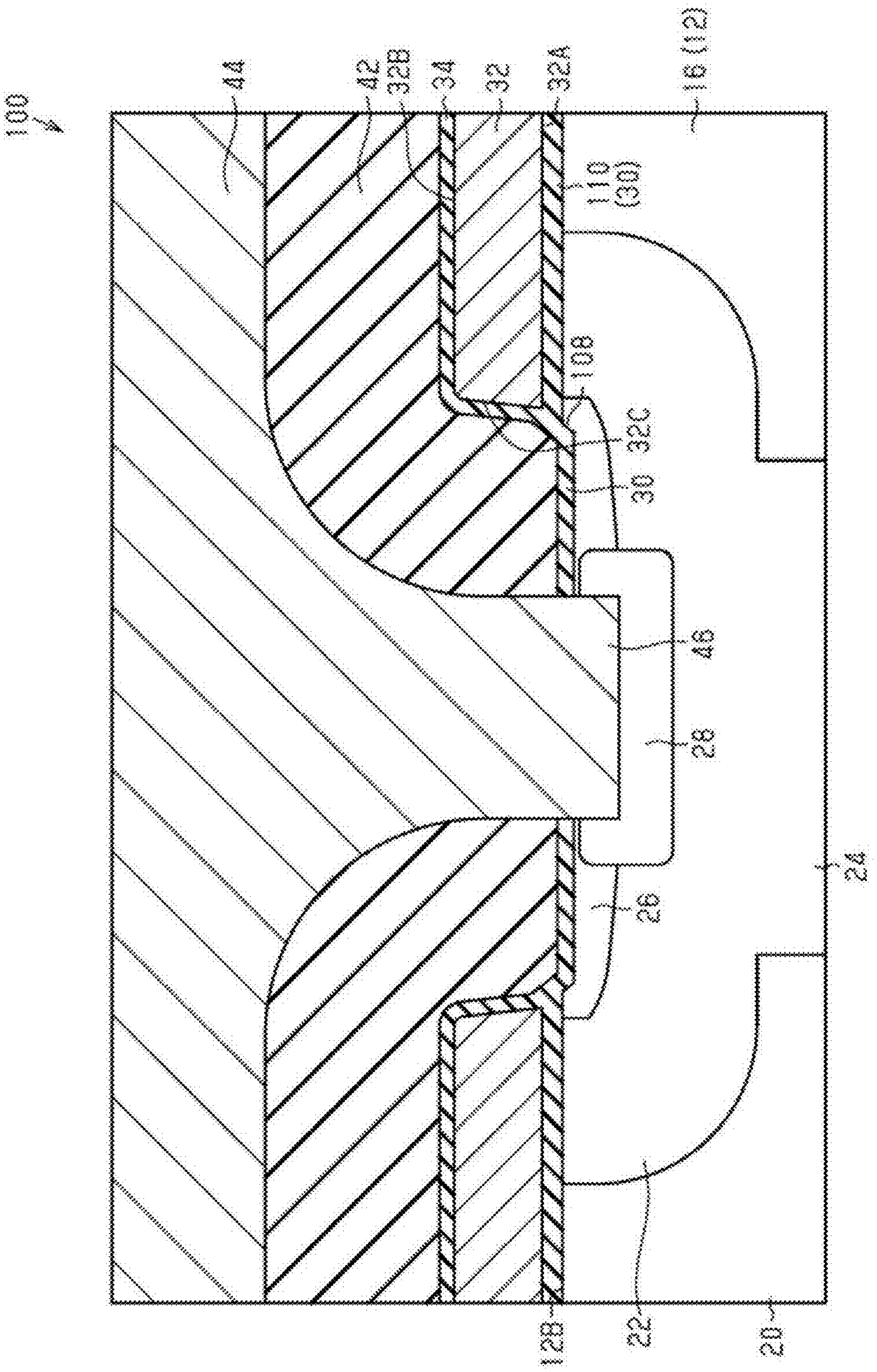
FIG. 12 is a schematic cross-sectional view of the semiconductor device according to the comparative example.

FIG. 12 is a schematic cross-sectional view of the semiconductor device 100 obtained through the same processes as the manufacturing processes of the semiconductor device 10 shown in FIGS. 7 to 10 after the etching process shown in FIG. 11. In FIG. 12, the same components as those of the semiconductor device 10 (in particular, see FIG. 2) are denoted by the same reference numerals.

In the semiconductor device 100, the step 108 of the semiconductor layer 12, which is formed in the etching process shown in FIG. 11, remains almost as it is. Further, when the second insulating layer 34 is formed by thermal oxidation, there may be a possibility that the step 108 becomes even larger than that after the process shown in FIG. 11. In the semiconductor device 100, since the step 108 is not located below the gate electrode 32, a cavity such as the cavity 38 shown in FIG. 2 is not formed. Further, in the semiconductor device 100, since the step 108 is not located below the gate electrode 32, the gate insulating portion 110 does not have a side surface located between the gate electrode 32 and the semiconductor layer 12.

A relatively large step 108 of the semiconductor layer 12 causes stress concentration in its vicinity. This stress concentration causes defects in the semiconductor layer 12, and as a result, a drain-source leakage current $I_{DSS}$ increases in the semiconductor device 100, as compared with the semiconductor device 10.

In contrast, in the method of manufacturing the semiconductor device 10 of the present embodiment, since the semiconductor layer 12 is partially exposed by forming the second opening 60 having the curved sidewall 58 in the insulating layer 50 by the isotropic etching, the exposed surface 62 of the semiconductor layer 12 can form a flat surface continuous with the second surface 12B of the semiconductor layer 12 covered with the insulating layer 50. By employing the isotropic etching, since the gate insulating portion 36 of the semiconductor device 10 includes the curved side surface 36A located between the gate electrode 32 and the semiconductor layer 12, the step 40 that can be formed during the manufacturing process is located below the gate electrode 32. This allows the step 40 to be relatively small. Therefore, according to the semiconductor device 10 and the method of manufacturing the semiconductor device 10 of the present embodiment, the step 40 formed in the semiconductor layer 12 can be reduced. The reduction of the step 40 alleviates the local stress concentration in the semiconductor layer 12 and, as a result, it is possible to suppress the generation of defects in the semiconductor layer 12. Therefore, in the semiconductor device 10, an increase in drain-source leakage current $I_{DSS}$ can be suppressed.

[Effects]

The semiconductor device 10 and the method of manufacturing the semiconductor device 10 of the present embodiment have the following advantages.

(1) Etching the insulating layer 50 may include partially exposing the semiconductor layer 12 by forming the second opening 60 having the curved sidewall 58 in the insulating layer 50 by isotropic etching. The exposed surface 62 of the semiconductor layer 12 can form a flat surface continuous with the second surface 12B of the semiconductor layer 12 covered with the insulating layer 50.

As a result, since the step 40 that can be formed in the semiconductor layer 12 during the manufacturing process of the semiconductor device 10 can be made relatively small, the generation of defects in the semiconductor layer 12 can be suppressed. As a result, an increase in drain-source leakage current $I_{DSS}$ can be suppressed.

(2) The curved sidewall 58 may be located between the gate electrode 32 and the semiconductor layer 12. As a result, since the step 40 formed in the vicinity of the curved sidewall 58 during the manufacturing process can be located below the gate electrode 32, it is possible to make the step 40 relatively small.

(3) The step 40 formed on the flat surface of the semiconductor layer 12 may be less than 25 nm in the direction orthogonal to the second surface 12B. As a result, since the local stress concentration in the semiconductor layer 12 can be made relatively small, the generation of defects in the semiconductor layer 12 can be suppressed, so that an increase in drain-source leakage current $I_{DSS}$ can be suppressed.

(4) Forming the thermal oxide layer 64 includes forming the cavity 38 surrounded by the thermal oxide layer 64, and at least a portion of the cavity 38 can be located between the gate electrode 32 and the semiconductor layer 12. Due to the existence of the cavity 38 located between the gate electrode 32 and the semiconductor layer 12, the stress concentration in the semiconductor layer 12 in the vicinity of the cavity 38 is alleviated, so that the generation of defects in the semiconductor layer 12 can be suppressed.

(5) Forming the thermal oxide layer 64 includes forming the cavity 38 surrounded by the thermal oxide layer 64, and at least a portion of the cavity 38 can be located between the gate electrode 32 and the step 40. Due to the existence of the cavity 38 located between the gate electrode 32 and the step 40, the stress concentration in the semiconductor layer 12 is alleviated in the vicinity of the step 40 where a stress tends to increase, so that it is possible to more effectively suppress the generation of defects in the semiconductor layer 12.

(6) The first insulating layer 30 includes the gate insulating portion 36 interposed between the gate electrode 32 and the semiconductor layer 12, and the gate insulating portion 36 may include the curved side surface 36A located between the gate electrode 32 and the semiconductor layer 12.

As a result, since the step 40 formed in the vicinity of the curved side surface 36A during the manufacturing process can be located below the gate electrode 32, the step 40 can be made relatively small.

Further, the curved side surface 36A located between the gate electrode 32 and the semiconductor layer 12 has a unique structure formed by isotropic etching, as described above. Therefore, it is recognized that the gate insulating portion 36 having the side surface 36A is subjected to the isotropic etching in the manufacturing process. As described above, the step 40 in the semiconductor device 10 is smaller than that formed by performing anisotropic etching. Therefore, according to the semiconductor device 10 in which the gate insulating portion 36 has the side surface 36A, the step 40 formed in the semiconductor layer 12 can be reduced. The reduction of the step 40 alleviates the local stress concentration in the semiconductor layer 12 and, as a result, the generation of defects in the semiconductor layer 12 can be suppressed. Therefore, in the semiconductor device 10, an increase in drain-source leakage current $I_{DSS}$ can be suppressed.

(7) The first insulating layer 30 and the second insulating layer 34 form the cavity 38 at least partially surrounded by the curved side surface 36A, and at least a portion of the cavity 38 can be located between the gate electrode 32 and the semiconductor layer 12. Due to the existence of the cavity 38 located between the gate electrode 32 and the semiconductor layer 12, the stress concentration in the semiconductor layer 12 is alleviated in the vicinity of the cavity 38, so that the generation of defects in the semiconductor layer 12 can be suppressed.

(8) The first insulating layer 30 and the second insulating layer 34 form the cavity 38 at least partially surrounded by the curved side surface 36A, and at least a portion of the cavity 38 can be located between the gate electrode 32 and the step 40. Due to the existence of the cavity 38 located between the gate electrode 32 and the step 40, the stress concentration in the semiconductor layer 12 is alleviated in the vicinity of the step 40 where a stress tends to increase and thus, the generation of defects in the semiconductor layer 12 can be more effectively suppressed.

[Modifications]

The above embodiment can be further modified and implemented as follows.

Figure 13:
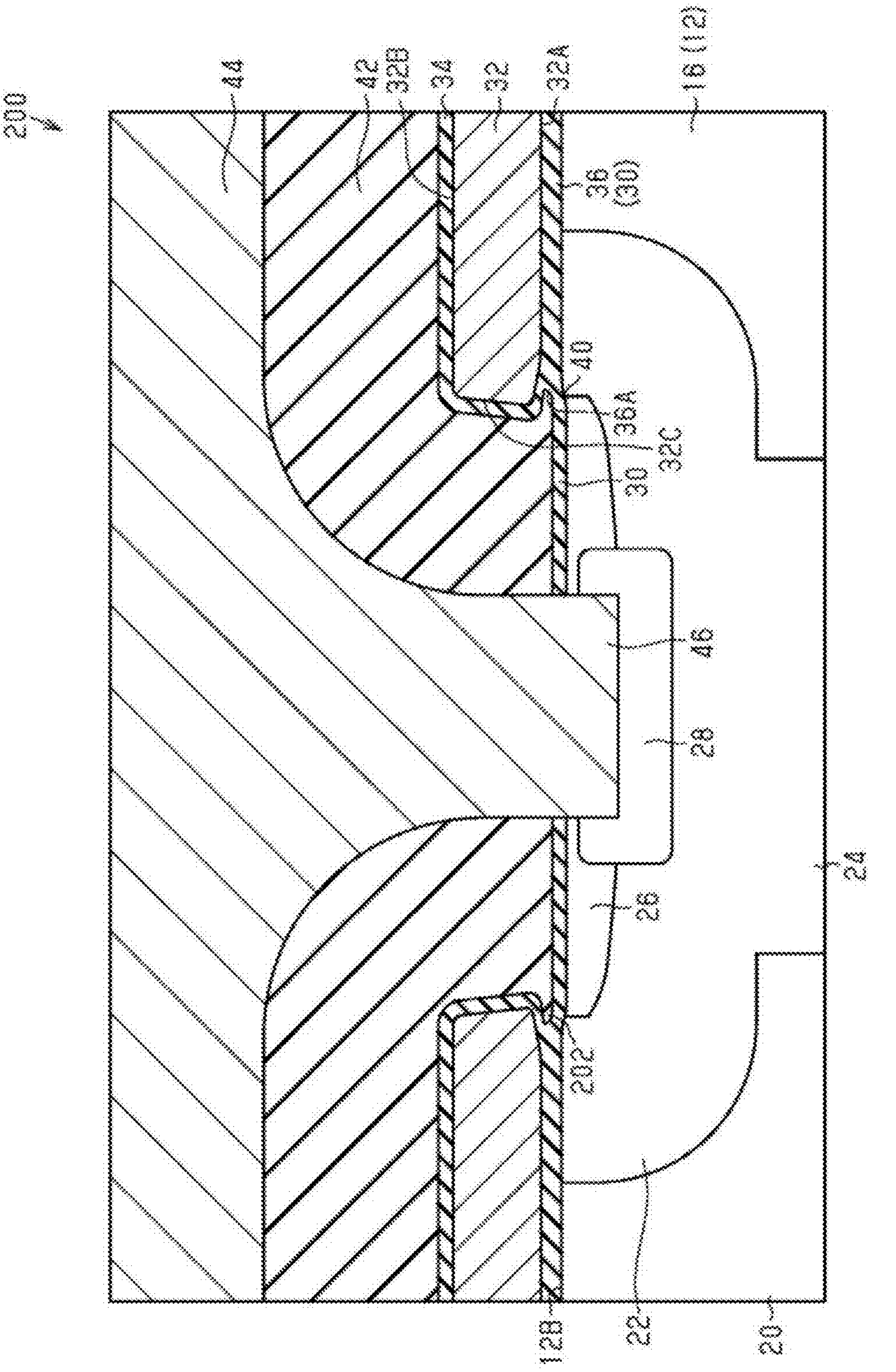
FIG. 13 is a schematic cross-sectional view of a semiconductor device according to a modification.

The first insulating layer 30 and the second insulating layer 34 may not form the cavity 38 as shown in FIG. 2. FIG. 13 is a schematic cross-sectional view of a semiconductor device 200 according to a modification. In FIG. 13, the same components as those of the semiconductor device 10 (in particular, see FIG. 2) are denoted by the same reference numerals. Further, detailed explanation of the same components as those of the semiconductor device 10 will be omitted.

In the semiconductor device 200 shown in FIG. 13, since the first insulating layer 30 and the second insulating layer 34 do not form a closed cavity, the third insulating layer 42 is buried in a gap 202 defined by the first insulating layer 30 and the second insulating layer 34. At least a portion of the gap 202 may be located between the gate electrode 32 and the semiconductor layer 12. At this time, the curved side surface 36A of the gate insulating portion 36 can be in contact with the third insulating layer 42.

Also in the semiconductor device 200 according to the modification, by employing isotropic etching, since the gate insulating portion 36 of the semiconductor device 10 includes the curved side surface 36A located between the gate electrode 32 and the semiconductor layer 12, the step 40 that can be formed during the manufacturing process is located below the gate electrode 32. This makes it possible to make the step 40 relatively small, and as a result, an increase in drain-source leakage current $I_{DSS}$ can be suppressed.

In the above embodiment, a structure in which the conductivity type of each region in the semiconductor layer 12 is reversed may be adopted. That is, the p-type region may be an n-type region, and the n-type region may be a p-type region.

One or more of the various examples described herein can be combined as long as they are not technically inconsistent. In the present disclosure, "at least one of A and B" should be understood as meaning "only A, only B, or both A and B."

The term "on" as used in the present disclosure includes the meanings of "on" and "above" unless clearly stated otherwise in the context. Accordingly, the expression "a first layer is formed on a second layer" is intended that in some embodiments, the first layer can be directly arranged on the second layer in contact with the second layer, but in other embodiments, the first layer can be arranged above the second layer not in contact with the second layer. That is, the term "on" does not exclude a structure in which other layers are formed between the first layer and the second layer.

The terms indicating directions such as "vertical," "horizontal," "upward," "downward," "upper," "lower," "forward," "backward," "lateral," "left," "right," "front," "back," etc., as used in the present disclosure depend on a particular orientation of a described and illustrated device. A variety of alternative orientations can be assumed in the present disclosure, and thus these directional terms should not be interpreted narrowly.

For example, the Z direction used in the present disclosure does not necessarily have to be the vertical direction, and it does not have to be exactly the same as the vertical direction. Therefore, various structures (for example, the structure shown in FIG. 1) according to the present disclosure are not limited to a structure in which "upper" and "lower" of the Z direction described herein are "upper" and "lower" of the vertical direction. For example, the X direction may be the vertical direction, or the Y direction may be the vertical direction.

[Supplementary Notes]

The technical ideas that can be understood from the present disclosure are described below. In addition, for the purpose of aiding understanding and not for the purpose of limitation, components described in Supplementary Notes are labeled with the reference numerals of the corresponding components in the embodiments. The reference numerals are provided as examples to aid understanding, and the components described in Supplementary Notes should not be limited to the components indicated by the reference numerals.

(Supplementary Note A1)

A method of manufacturing a semiconductor device (10) having a super junction structure, including:

forming a first-conductivity-type semiconductor layer (12) having a first surface (12A) and a second surface (12B) opposite to the first surface (12A);

forming a second-conductivity-type pillar region (24) in the semiconductor layer (12);

forming an insulating layer (50) which covers the second surface (12B) of the semiconductor layer (12);

forming a metal layer (52) on the insulating layer (50);

forming a gate electrode (32) including a first opening (54) passing through the metal layer (52) by selectively removing the metal layer (52); and etching the insulating layer (50) via the first opening (54), wherein the act of etching the insulating layer (50) includes partially exposing the semiconductor layer (12) by forming a second opening (60) having a curved sidewall (58) in the insulating layer (50) by isotropic etching, and wherein an exposed surface (62) of the semiconductor layer (12) forms a flat surface continuous with the second surface (12B) of the semiconductor layer (12) covered with the insulating layer (50).

(Supplementary Note A2)

The method of Supplementary Note A1, wherein the curved sidewall (58) is located between the gate electrode (32) and the semiconductor layer (12).

(Supplementary Note A3)

The method of Supplementary Note A1 or A2, wherein the second opening (60) has a smaller dimension as it approaches closer to the second surface (12B) of the semiconductor layer (12) than the gate electrode (32).

(Supplementary Note A4)

The method of any one of Supplementary Notes A1 to A3, further including: forming a thermal oxide film (64) on the gate electrode (32), the insulating layer (50), and the semiconductor layer (12).

(Supplementary Note A5)

The method of Supplementary Note A4, wherein the act of forming the thermal oxide film (64) includes forming a step (40) in the flat surface (62, 12B), and wherein the step (40) is located below the gate electrode (32).

(Supplementary Note A6)

The method of Supplementary Note A5, wherein the step (40) is less than 25 nm in a direction orthogonal to the second surface (12B).

(Supplementary Note A7)

The method of any one of Supplementary Notes A4 to A6, wherein the act of forming the thermal oxide layer (64) includes forming a cavity (38) surrounded by the thermal oxide layer (64), and wherein at least a portion of the cavity (38) is located between the gate electrode (32) and the semiconductor layer (12).

(Supplementary Note A8)

The method of Supplementary Note A5 or A6, wherein the act of forming the thermal oxide layer (64) includes forming a cavity (38) surrounded by the thermal oxide layer (64), and wherein at least a portion of the cavity (38) is located between the gate electrode (32) and the step (40).

(Supplementary Note A9)

The method of any one of Supplementary Notes A4 to A8, further including: forming a CVD film (66) on the thermal oxide film (64).

(Supplementary Note A10)

The method of any one of Supplementary Notes A4 to A9, further including; implanting impurities into the semiconductor layer (12) via the first opening (54), wherein the impurities are diffused into the semiconductor layer (12) in forming the thermal oxide film (64).

(Supplementary Note B1)

A semiconductor device (10) having a super junction structure, including:

a semiconductor layer (12) having a first surface (12A) and a second surface (12B) opposite to the first surface (12A);

a first insulating layer (30) formed on the second surface (12B) of the semiconductor layer (12);

a gate electrode (32) formed on the first insulating layer (30);

a second insulating layer (34) formed on the gate electrode (32);

a third insulating layer (42) which covers the first insulating layer (30) and the second insulating layer (34); and a source electrode (44) which is formed on the third insulating layer (42) and includes a source contact portion (46) in contact with the semiconductor layer (12) by passing through the first insulating layer (30) and the third insulating layer (42), wherein the first insulating layer (30) includes a gate insulating portion (36) interposed between the gate electrode (32) and the semiconductor layer (12), and the gate insulating portion (36) includes a curved side surface (36A) located between the gate electrode (32) and the semiconductor layer (12).

(Supplementary Note B2)

The semiconductor device (10) of Supplementary Note B1, wherein the first insulating layer (30) and the second insulating layer (34) are formed of a thermal oxide film, and wherein the third insulating layer (42) is formed of a CVD film.

(Supplementary Note B3)

The semiconductor device (10) of Supplementary Note B1 or B2, wherein the second surface (12B) of the semiconductor layer (12) includes a step (40) located below the gate electrode (32).

(Supplementary Note B4)

The semiconductor device (10) of Supplementary Note B3, wherein the step (40) is less than 25 nm in a direction orthogonal to the second surface (12B).

(Supplementary Note B5)

The semiconductor device (10) of any one of Supplementary Notes B1 to B4, wherein the first insulating layer (30) and the second insulating layer (34) form a cavity (38) at least partially surrounded by the curved side surface (36A), and wherein at least a portion of the cavity (38) is located between the gate electrode (32) and the semiconductor layer (12).

(Supplementary Note B6)

The semiconductor device (10) of Supplementary Note B3 or B4, wherein the first insulating layer (30) and the second insulating layer (34) form a cavity (38) at least partially surrounded by the curved side surface (36A), and wherein at least a portion of the cavity (38) being located between the gate electrode (32) and the step (40).

(Supplementary Note B7)

The semiconductor device (200) of any one of Supplementary Notes B1 to B4, wherein the curved side surface (36A) is in contact with the third insulating layer (42).

(Supplementary Note B8)

The semiconductor device (10; 200) of any one of Supplementary Notes B1 to B7, wherein the curved side surface (36A) is formed by isotropic etching.

(Supplementary Note B9)

The semiconductor device (10; 200) of any one of Supplementary Notes B1 to B8, wherein the semiconductor layer (12) includes:

a first-conductivity-type drain region (18) having the first surface (12A);

a first-conductivity-type drift region (20) formed on the drain region (18);

a second-conductivity-type channel region (22) formed on the second surface (12B); and a second-conductivity-type pillar region (24) connected to the channel region (22) and extending toward the drain region (18).

(Supplementary Note C1)

A semiconductor device (10) having a super junction structure, including:

a semiconductor layer (12) having a first surface (12A) and a second surface (12B) opposite to the first surface (12A);

a first insulating layer (30) formed on the second surface (12B) of the semiconductor layer (12);

a gate electrode (32) formed on the first insulating layer (30);

a second insulating layer (34) formed on the gate electrode (32);

a third insulating layer (42) which covers the first insulating layer (30) and the second insulating layer (34); and a source electrode (44) which is formed on the third insulating layer (42) and includes a source contact portion (46) in contact with the semiconductor layer (12) by passing through the first insulating layer (30) and the third insulating layer (42), wherein the second surface (12B) of the semiconductor layer (12) includes a step (40) located below the gate electrode (32).

(Supplementary Note C2)

The semiconductor device (10) of Supplementary Note C1, wherein the step (40) is less than 25 nm in a direction orthogonal to the second surface (12B).

(Supplementary Note C3)

The semiconductor device (10) of Supplementary Note C1 or C2, wherein the first insulating layer (30) includes a gate insulating portion (36) interposed between the gate electrode (32) and the semiconductor layer (12), and the gate insulating portion (36) includes a curved side surface (36A) located between the gate electrode (32) and the semiconductor layer (12).

(Supplementary Note C4)

The semiconductor device (10) of Supplementary Note C3, wherein the first insulating layer (30) and the second insulating layer (34) form a cavity (38) at least partially surrounded by the curved side surface (36A), and wherein at least a portion of the cavity (38) is located between the gate electrode (32) and the step (40).

(Supplementary Note C5)

The semiconductor device (200) of Supplementary Note C3 or C4, wherein the curved side surface (36A) is in contact with the third insulating layer (42).

(Supplementary Note C6)

The semiconductor device (10; 200) of any one of Supplementary Notes C1 to C5, wherein the first insulating layer (30) and the second insulating layer (34) are formed of a thermal oxide film, and wherein the third insulating layer (42) is formed of a CVD film.

(Supplementary Note C7)

The semiconductor device (10; 200) of any one of Supplementary Notes C1 to C6, wherein the semiconductor layer (12) includes:

a first-conductivity-type drain region (18) including the first surface (12A);

a first-conductivity-type drift region (20) formed on the drain region (18);

a second-conductivity-type channel region (22) formed on the second surface (12B); and a second-conductivity-type pillar region (24) connected to the channel region (22) and extending toward the drain region (18).

The above description is merely an example. Those skilled in the art will appreciate that more possible combinations and substitutions are possible beyond the components and methods (manufacturing processes) enumerated for the purposes of illustrating the techniques of the present disclosure. The present disclosure is intended to cover all alternatives, modifications, and changes that fall within the scope of the present disclosure, including the claims.

According to the present disclosure in some embodiments, it is possible to reduce a step formed in a semiconductor layer in a semiconductor device having a super junction structure.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device having a super junction structure, comprising:

a semiconductor layer having a first surface and a second surface opposite to the first surface;

a first insulating layer formed on the second surface of the semiconductor layer;

a gate electrode formed on the first insulating layer;

a second insulating layer formed on the gate electrode;

a third insulating layer which covers the first insulating layer and the second insulating layer; and a source electrode which is formed on the third insulating layer and includes a source contact portion in contact with the semiconductor layer by passing through the first insulating layer and the third insulating layer, wherein the first insulating layer includes a gate insulating portion interposed between the gate electrode and the semiconductor layer, and the gate insulating portion includes a curved side surface located between the gate electrode and the semiconductor layer, wherein a minimum distance between the curved side surface and the semiconductor layer is smaller than a minimum distance between the gate electrode and the semiconductor layer, wherein the first insulating layer and the second insulating layer form a cavity such that at least a portion of the cavity is directly surrounded by the curved side surface, and wherein at least the portion of the cavity is located between the gate electrode and the semiconductor layer.

2. The semiconductor device of claim 1, wherein the first insulating layer and the second insulating layer are formed of a thermal oxide film, and wherein the third insulating layer is formed of a CVD film.

3. The semiconductor device of claim 1, wherein the semiconductor layer includes a step located below the gate electrode.

4. The semiconductor device of claim 3, wherein the step is less than 25 nm with respect to the second surface in a direction orthogonal to the second surface.

5. The semiconductor device of claim 3, wherein at least a portion of the cavity is located between the gate electrode and the step.

6. The semiconductor device of claim 1, wherein the semiconductor layer includes:

a first-conductivity-type drain region having the first surface;

a first-conductivity-type drift region formed on the drain region;

a second-conductivity-type channel region formed on the second surface; and a second-conductivity-type pillar region connected to the channel region and extending toward the drain region.

7. The semiconductor device of claim 1, wherein the semiconductor layer includes a source region, and wherein the curved side surface is located to overlap with the source region in a plan view.

* * * * *